(12) United States Patent
Lee et al.

(10) Patent No.: US 10,732,781 B2
(45) Date of Patent: Aug. 4, 2020

(54) FREE FORM TOUCH DEVICE

(71) Applicant: Au Optronics Corporation, Hsinchu (TW)

(72) Inventors: Chia-Chi Lee, Hsinchu (TW); Zeng-De Chen, Yunlin County (TW)

(73) Assignee: Au Optronics Corporation, Hsinchu (TW)

( * ) Notice: Subject to any disclaimer, the term of this patent is extended or adjusted under 35 U.S.C. 154(b) by 83 days.

(21) Appl. No.: 16/240,794

(22) Filed: Jan. 7, 2019

(65) Prior Publication Data

US 2020/0057516 A1   Feb. 20, 2020

(30) Foreign Application Priority Data

Aug. 17, 2018   (TW) .............................. 107128764 A

(51) Int. Cl.
*G06F 3/044* (2006.01)
*H01L 27/32* (2006.01)
*H01L 51/52* (2006.01)

(52) U.S. Cl.
CPC ............ *G06F 3/044* (2013.01); *H01L 27/323* (2013.01); *H01L 51/5203* (2013.01)

(58) Field of Classification Search
CPC .... G06F 3/044; H01L 51/5203; H01L 27/323
See application file for complete search history.

(56) References Cited

U.S. PATENT DOCUMENTS

| | | | |
|---|---|---|---|
| 5,528,056 | A | 6/1996 | Shimada et al. |
| 8,730,196 | B2 | 5/2014 | Hotelling et al. |
| 8,786,557 | B2 | 7/2014 | Noguchi et al. |
| 2016/0328080 | A1 | 11/2016 | Miyake |

*Primary Examiner* — Kent W Chang
*Assistant Examiner* — Chayce R Bibbee
(74) *Attorney, Agent, or Firm* — JCIPRNET

(57) ABSTRACT

A free form touch device includes a substrate, a first switching device, a first touch electrode, a second switching device, and a second touch electrode. The first switching device includes a first channel layer, a first gate, a first source, and a first drain. An overlapping width of the first gate and the first channel layer is W1, and an overlapping length of the first gate and the first channel layer is L1. The first touch electrode is electrically connected with the first switching device. An area of the first touch electrode is A1. The second switching device includes a second channel layer, a second gate, a second source, and a second drain. An overlapping width of the second gate and the second channel layer is W2, and an overlapping length of the second gate and the second channel layer is L2, W1/L1>W2/L2. The second touch electrode is electrically connected with the second switching device. An area of the second touch electrode is A2, and A1>A2.

17 Claims, 13 Drawing Sheets

10

FREE FORM TOUCH DEVICE

CROSS-REFERENCE TO RELATED APPLICATION

This application claims the priority benefit of Taiwan application serial no. 107128764, filed on Aug. 17, 2018. The entirety of the above-mentioned patent application is hereby incorporated by reference herein and made a part of this specification.

BACKGROUND OF THE INVENTION

1. Field of the Invention

The invention relates to a touch device, and more particularly, relates to a free form touch device.

2. Description of Related Art

With the advancement of technology, the appearance rate of touch devices in the market has gradually increased, and various related technologies have also emerged in an endless stream. In order to increase the attraction of products to consumers, various manufacturers are committed to the development of a free form touch device Because the free form touch device is different from the conventional touch device in rectangular shape, the free form touch device can attract the attention of the consumers with apparent variability.

However, in the free form touch device, a touch electrode at an edge region usually has an area different from an area of a touch electrode at a central region. Because different areas would result in two different capacitances, the touch electrode at the edge region would have a signal recovery speed different form that of the touch electrode at the central region. Therefore, the free form touch device is prone to abnormality.

SUMMARY OF THE INVENTION

At least one embodiment of the invention provides a free form touch device capable of solving an issue regarding different touch electrodes having different signal recovery speeds.

At least one embodiment of the invention provides a free form touch device, which includes a substrate, a first switching device, a first touch electrode, a second switching device, and a second touch electrode. The first switching device includes a first channel layer, a first gate, a first source, and a first drain. An overlapping width of the first gate and the first channel layer is W1, and an overlapping length of the first gate and the first channel layer is L1. The first touch electrode is located on the substrate, and electrically connected with the first switching device. An area of the first touch electrode is A1. The second switching device includes a second channel layer, a second gate, a second source, and a second drain. An overlapping width of the second gate and the second channel layer is W2, and an overlapping length of the second gate and the second channel layer is L2, W1/L1>W2/L2. The second touch electrode is located on the substrate, and electrically connected with the second switching device. An area of the second touch electrode is A2, and A1>A2.

At least one embodiment of the invention provides a free form touch device, which includes a substrate, a first switching device, a first touch electrode, a first capacitor, a second capacitor, a second switching device, and a second touch electrode. The first touch electrode is located on the substrate, and electrically connected with the first switching device. An area of the first touch electrode is A1. The first capacitor is electrically connected between the first switching device and the first touch electrode. The second touch electrode is located on the substrate, and electrically connected with the second switching device. An area of the second touch electrode is A2, and A1>A2. The second capacitor is electrically connected between the second switching device and the second touch electrode. A capacitance of the first capacitor is less than a capacitance of the second capacitor.

One of the objects of the invention is to solve the issue regarding different touch electrodes having different signal recovery speeds.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
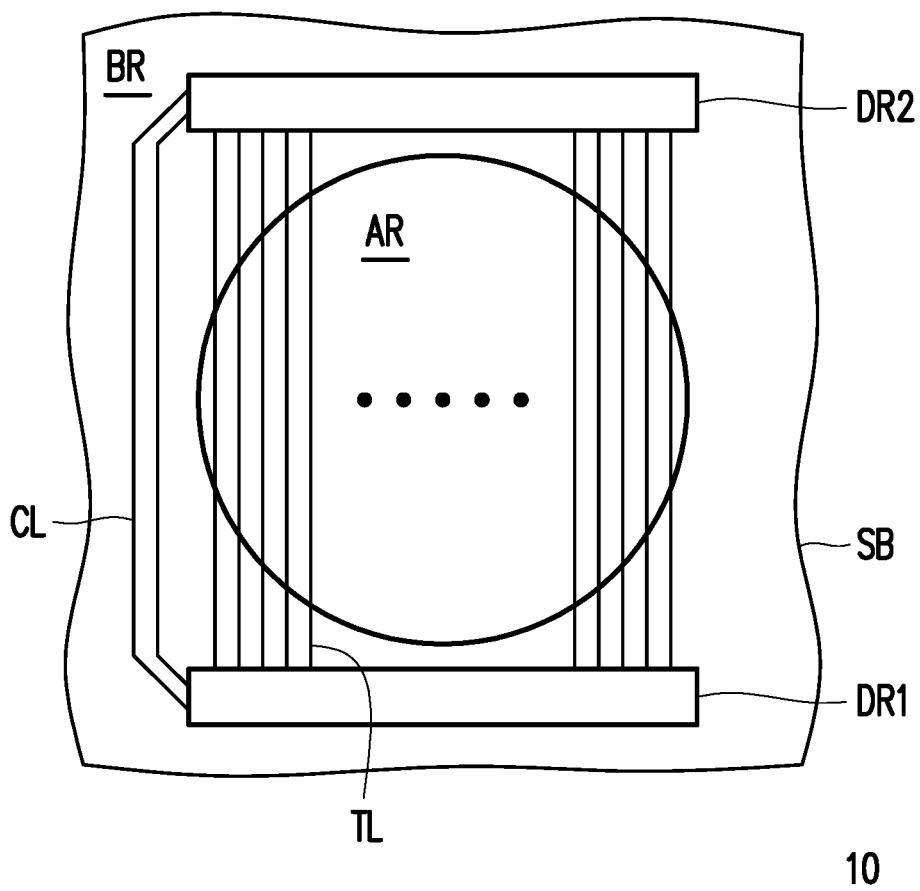
FIG. 1A is a top view of a free form touch device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
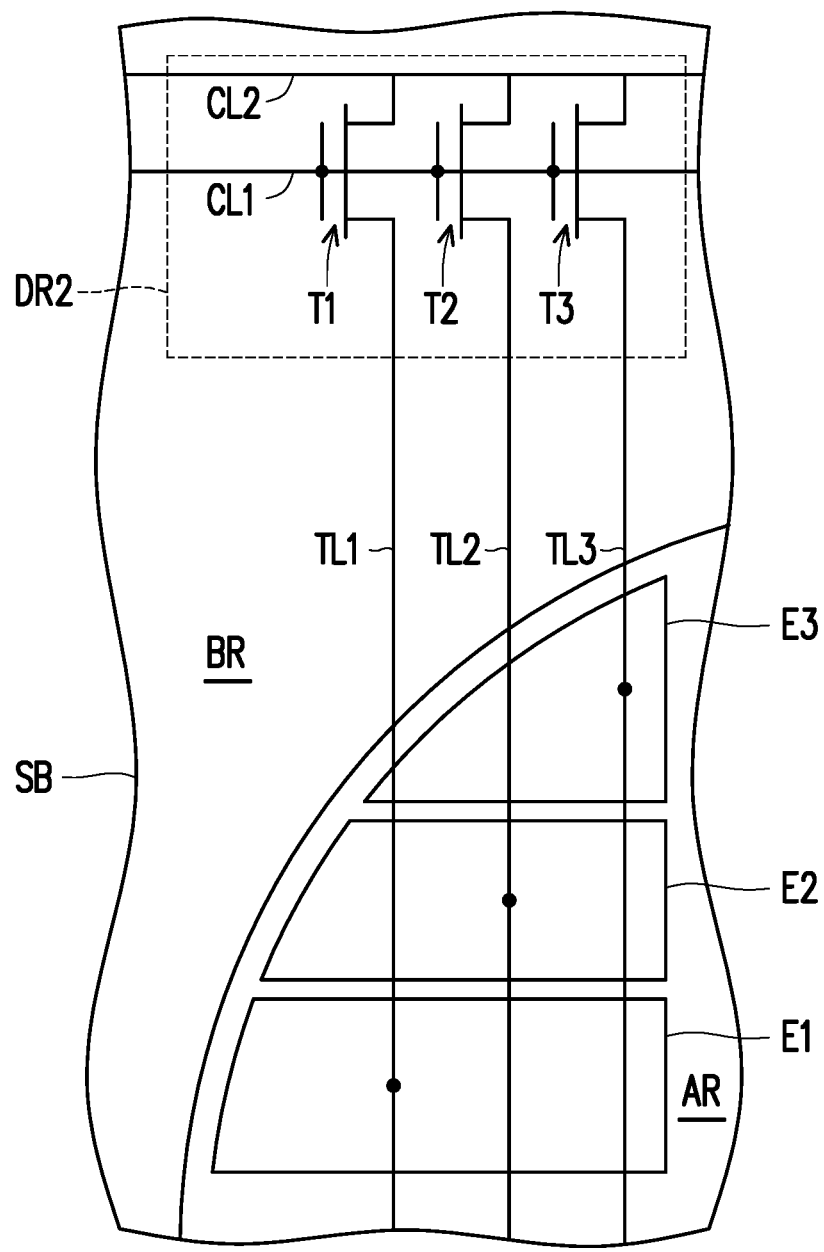
FIG. 1B is a partial view of the free form touch device of FIG. 1A.

FIG. 1A is a top view of a free form touch device according to an embodiment of the invention. FIG. 1B is a partial view of the free form touch device of FIG. 1A. For descriptive convenience, illustration of a part of components of the free form touch device is omitted in FIG. 1A and FIG. 1B, and illustration of touch electrodes in FIG. 1B is omitted in FIG. 1A.

With reference to FIG. 1A and FIG. 1B, a free form touch device 10 includes a substrate SB, a driving circuit DR1, a switch module DR2 and a plurality of touch electrodes. The substrate SB has an active region AR and a peripheral region BR located on at least one side of the active region AR. The active region AR is, for example, a non-rectangular region. A shape of the non-rectangular region is, for example, round or oval. In some embodiments, the substrate SB is a non-rectangular free form substrate.

The driving substrate DR1 and the switch module DR2 are located on the peripheral region BR of the substrate SB, and the driving substrate DR1 and the switch module DR2 are electrically connected with each other through a plurality of connection lines CL and a plurality of touch electrode lines TL. The connection lines CL are electrically connected between the driving circuit DR1 and the switch module DR2, and the touch electrode lines TL are electrically connected between the driving circuit DR1 and the switch module DR2. The connection lines CL do not overlap with the active region AR, for example. At least part of the touch electrode lines TL overlaps with the active region AR. The driving circuit DR1 is configured to provide a touch signal, and the driving circuit DR1 is, for example, a chip additionally manufactured or a circuit formed on the substrate SB, but the invention is not limited thereto. In this embodiment, the connection lines CL include, for example, a first connection line CL1 and a second connection line CL2, but the invention is not limited thereto. In other embodiments, the number of the connection lines CL may be adjusted based on actual requirements. In this embodiment, the touch electrode lines TL include, for example, a first touch electrode line TL1, a second touch electrode line TL2 and a third touch electrode line TL3, but the invention is not limited thereto. In other embodiments, the number of the touch electrode lines TL may be adjusted based on actual requirements. In this embodiment, the switch module DR2 includes a first switching device T1, a second switching device T2 and a third switching device T3, but the invention is not limited thereto. In other embodiments, the number of the switching devices of the switch module DR2 may be adjusted based on actual requirements.

In this embodiment, the touch electrodes, including a first touch electrode E1, a second touch electrode E2 and a third touch electrode E3, are located on the active region AR of the substrate SB, but the invention is not limited thereto. In other embodiments, the number of the touch electrodes may be adjusted based on actual requirements. The first touch electrode E1, the second touch electrode E2 and the third touch electrode E3 are electrically connected with the first touch electrode line TL1, the second touch electrode line TL2 and the third touch electrode line TL3, respectively. The first touch electrode E1, the second touch electrode E2 and the third touch electrode E3 has different shapes, for example.

An area of the first touch electrode E1 is A1; an area of the second touch electrode E2 is A2; and an area of the third touch electrode E3 is A3. More specifically, a vertical projection area of the first touch electrode E1 on the substrate SB is A1; a vertical projection area of the second touch electrode E2 on the substrate SB is A2; and a vertical projection area of the third touch electrode E3 on the substrate SB is A3. In this embodiment, A1>A2>A3.

Figure 2A:
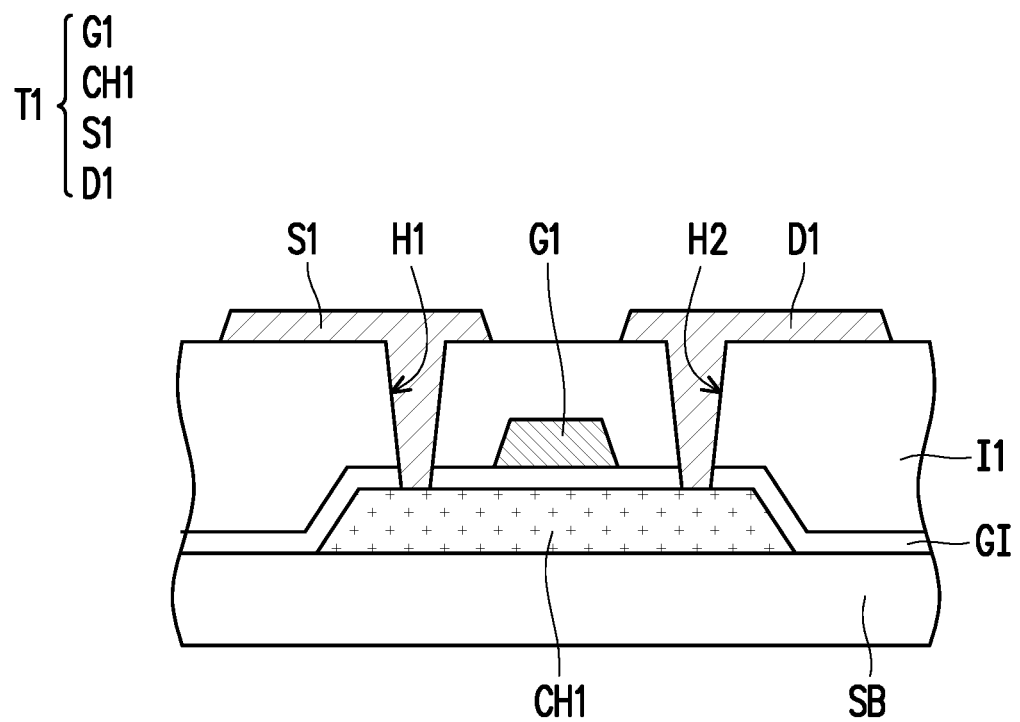
FIG. 2A is a cross-sectional view of a first switching device according to an embodiment of the invention.
Figure 2B:
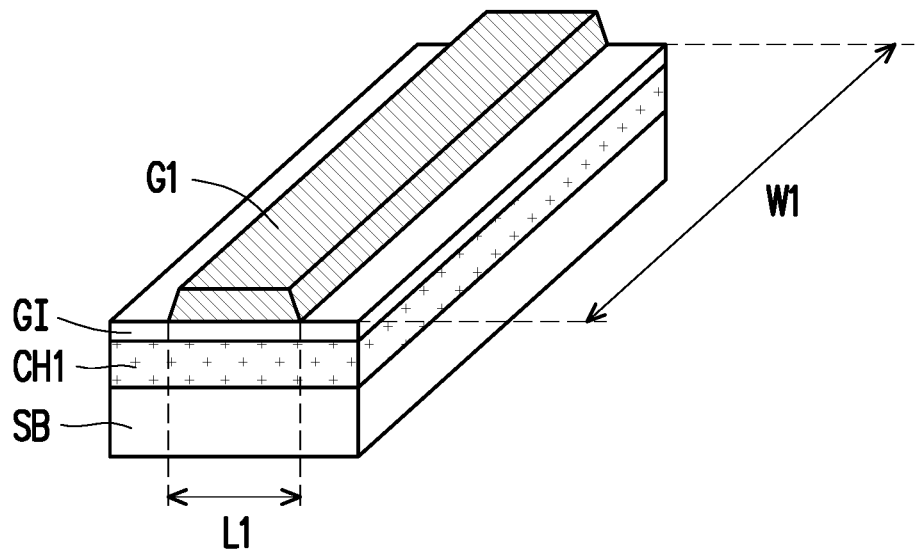
FIG. 2B is a perspective view illustrating a part of the components in the first switching device of FIG. 2A.

FIG. 2A is a cross-sectional view of a first switching device according to an embodiment of the invention. FIG. 2B is a perspective view illustrating a part of the components in the first switching device of FIG. 2A.

Referring to FIG. 1B, FIG. 2 and FIG. 2B together, the first switching device T1 includes a first channel layer CH1, a first gate G1, a first source S1, and a first drain D1. The first gate G1 is electrically connected with the first connection line CL1. The first gate G1 overlaps with the first channel layer CH1, and a gate insulation layer GI is interposed between the first gate G1 and the first channel layer CH1. A first insulation layer I1 covers the first gate G1. The first source S1 and the first drain D1 are located on the first insulation layer I1, and electrically connected with the first channel layer CH1 through openings H1 and H2, respectively. The openings H1 and H2 at least penetrate the first insulation layer I1. In this embodiment, the openings H1 and H2 penetrate the gate insulation layer GI and the first insulation layer I1. The first source S1 is electrically connected with the second connection line CL2.

The first touch electrode E1 is electrically connected with the first drain D1 of the first switching device T1 through the first touch electrode line TL1.

Figure 3A:
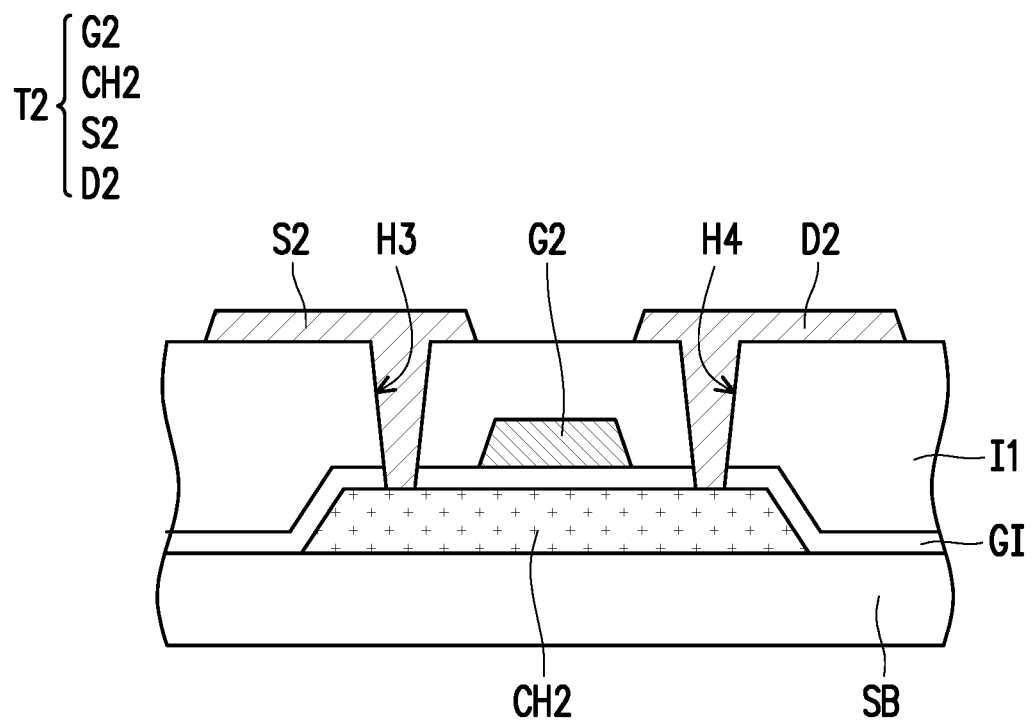
FIG. 3A is a cross-sectional view of a second switching device according to an embodiment of the invention.
Figure 3B:
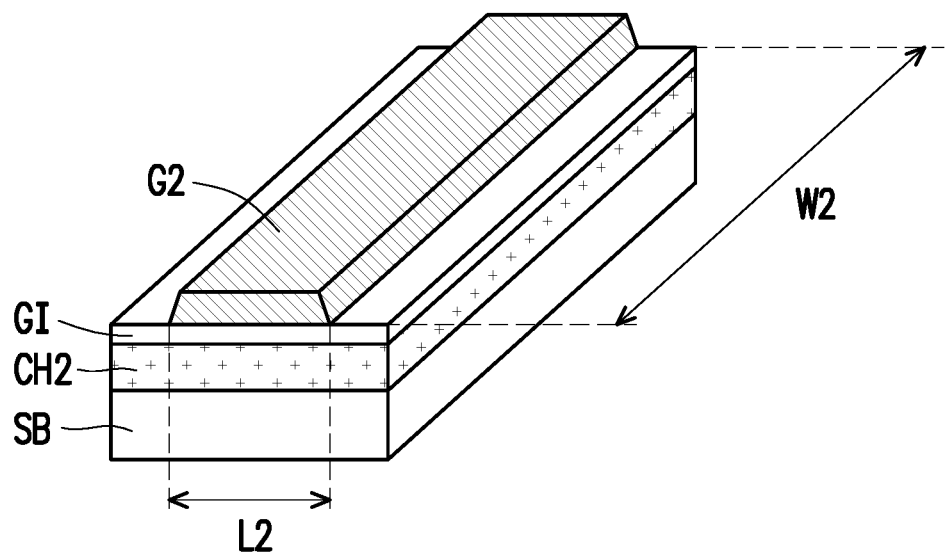
FIG. 3B is a perspective view illustrating a part of the components in the second switching device of FIG. 3A.

FIG. 3A is a cross-sectional view of a second switching device according to an embodiment of the invention. FIG. 3B is a perspective view illustrating a part of the components in the second switching device of FIG. 3A.

Referring to FIG. 1B, FIG. 3A and FIG. 3B together, the second switching device T2 includes a second channel layer CH2, a second gate G2, a second source S2, and a second drain D2. The second gate G2 is electrically connected with the first connection line CL1. The second gate G2 overlaps with the second channel layer CH2, and the gate insulation layer GI is interposed between the second gate G2 and the second channel layer CH2. A first insulation layer I1 covers the second gate G2. The second source S2 and the second drain D2 are located on the first insulation layer I1, and electrically connected with the second channel layer CH1 through openings H3 and H4, respectively. The openings H3 and H4 at least penetrate the first insulation layer I1. In this embodiment, the openings H3 and H4 penetrate the gate insulation layer GI and the first insulation layer I1. The second source S2 is electrically connected with the second connection line CL2.

The second touch electrode E2 is electrically connected with the second drain D2 of the second switching device T2 through the second touch electrode line TL2.

Figure 4A:
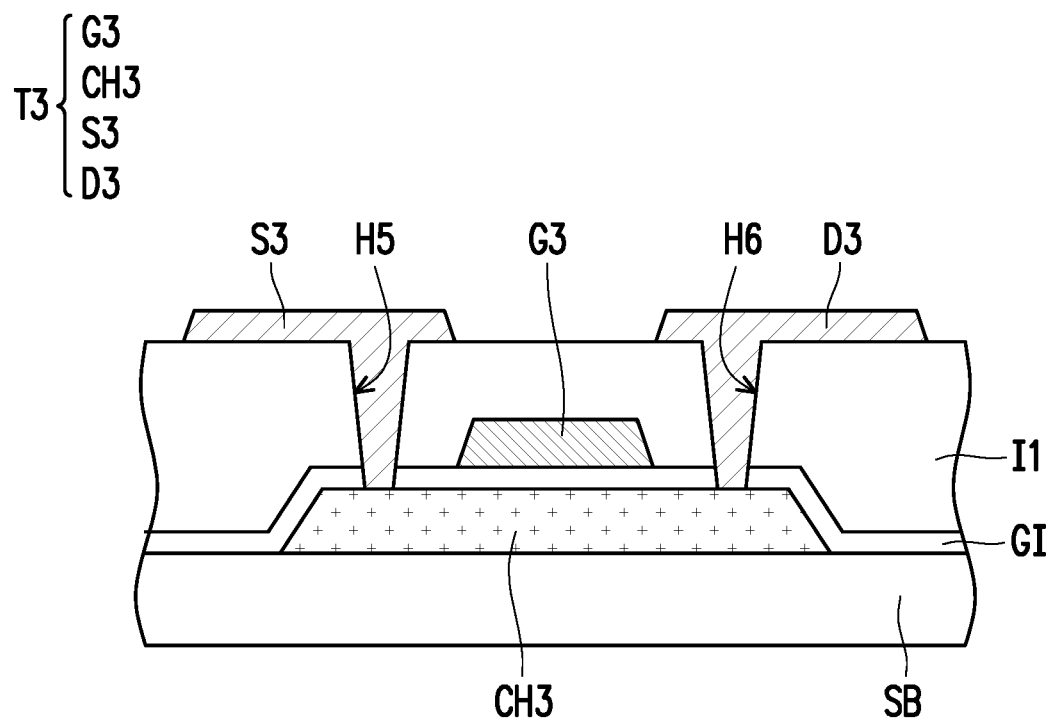
FIG. 4A is a cross-sectional view of a third switching device according to an embodiment of the invention.
Figure 4B:
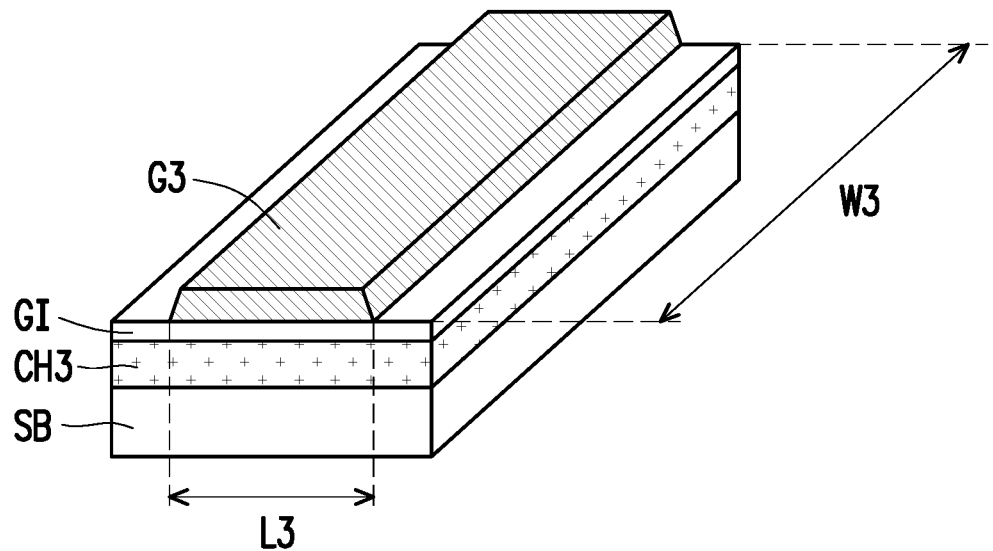
FIG. 4B is a perspective view illustrating a part of the components in the third switching device of FIG. 4A.

FIG. 4A is a cross-sectional view of a third switching device according to an embodiment of the invention. FIG. 4B is a perspective view illustrating a part of the components in the third switching device of FIG. 4A.

Referring to FIG. 1B, FIG. 4A and FIG. 4B together, the third switching device T3 includes a third channel layer CH3, a third gate G3, a third source S3, and a third drain D3. The third gate G3 is electrically connected with the first connection line CL1. The third gate G3 overlaps with the third channel layer CH3, and the gate insulation layer GI is interposed between the third gate G3 and the third channel layer CH3. The first insulation layer I1 covers the third gate G3. The third source S3 and the third drain D3 are located on the first insulation layer I1, and electrically connected with the third channel layer CH3 through openings H5 and H6, respectively. The openings H5 and H6 at least penetrate the first insulation layer I1. In this embodiment, the openings H5 and H6 penetrate the gate insulation layer GI and the first insulation layer I1. The third source S3 is electrically connected with the second connection line CL2.

The third touch electrode E3 is electrically connected with the third drain D3 of the third switching device T3 through the third touch electrode line TL3.

Referring to FIG. 2B, FIG. 3B and FIG. 4B together, an overlapping width of the first gate G1 and the first channel layer CH1 is W1, and an overlapping length of the first gate G1 and the first channel layer CH1 is L1. An overlapping width of the second gate G2 and the second channel layer CH2 is W2, and an overlapping length of the second gate G2 and the second channel layer CH2 is L2. An overlapping width of the third gate G3 and the third channel layer CH3 is W3, and an overlapping length of the third gate G3 and the third channel layer CH3 is L3. In this embodiment, W1/L1>W2/L2>W3/L3.

Because the overlapping width of the gate and the channel layer in the switching device is negatively correlated with an impedance of the switching device and the overlapping length of the gate and the channel layer is positively correlated with the impedance of the switching device, an impedance of the third switching device T3 is greater than an impedance of the second switching device T2 and the impedance of the second switching devices T2 is greater than an impedance of the first switching device T1.

By electrically connecting the first switching device T1, the second switching device T2 and the third switching device T3 having different impedances with the first touch electrode E1, the second touch electrode E2 and the third touch electrode E3 respectively, an uneven RC loading distribution problem caused by different areas of the first touch electrode E1, the second touch electrode E2 and the third touch electrode E2 may be corrected. In this way, the issue regarding the first touch electrode E1, the second touch electrode E2 and the third touch electrode E3 having different signal recovery speeds may be solved.

In this embodiment, although the first switching device T1, the second switching device T2 and the third switching device T3 are exemplified by a thin film transistor of a top gate type, the invention is not limited thereto. In other embodiments, the first switching device T1, the second switching device T2 and the third switching device T3 may also be a thin film transistor of a bottom gate type or other types.

Figure 5A:
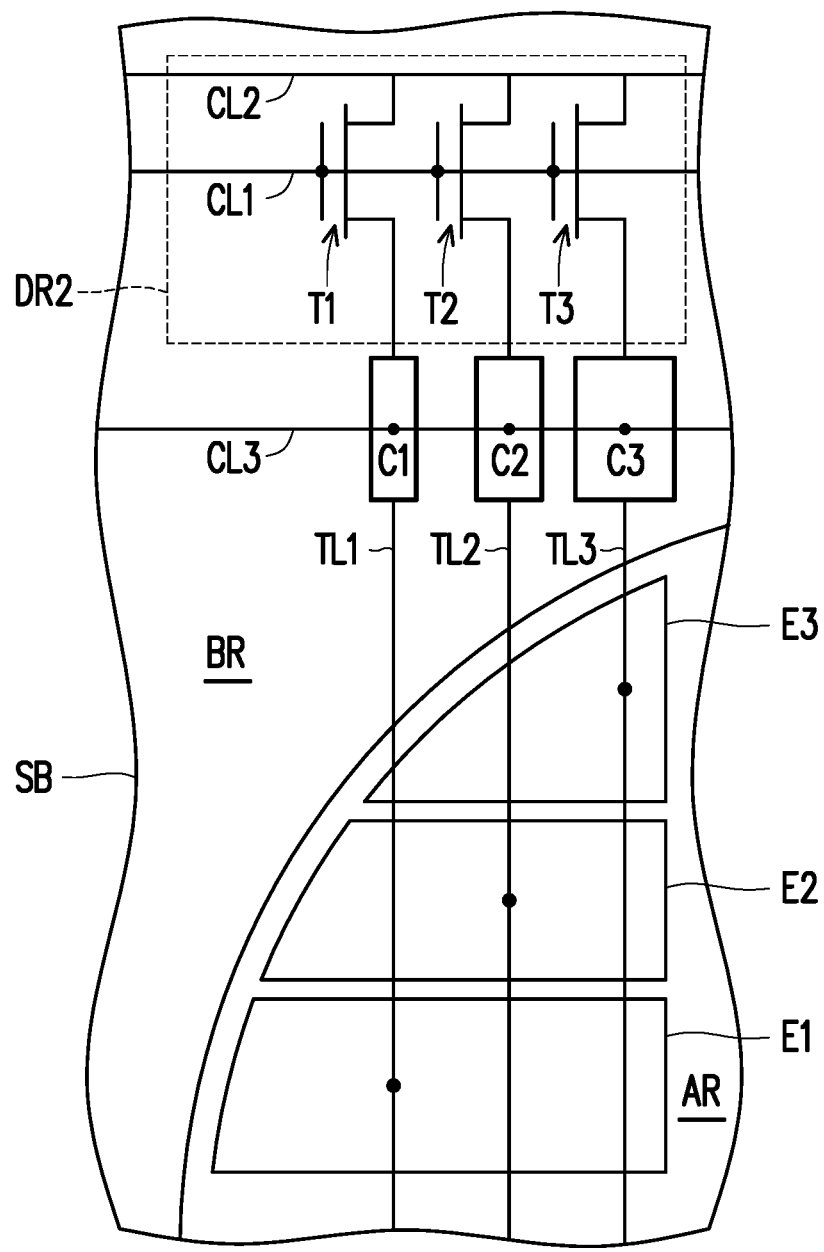
FIG. 5A is a partial top view of a free form touch device according to an embodiment of the invention.
Figure 5B:
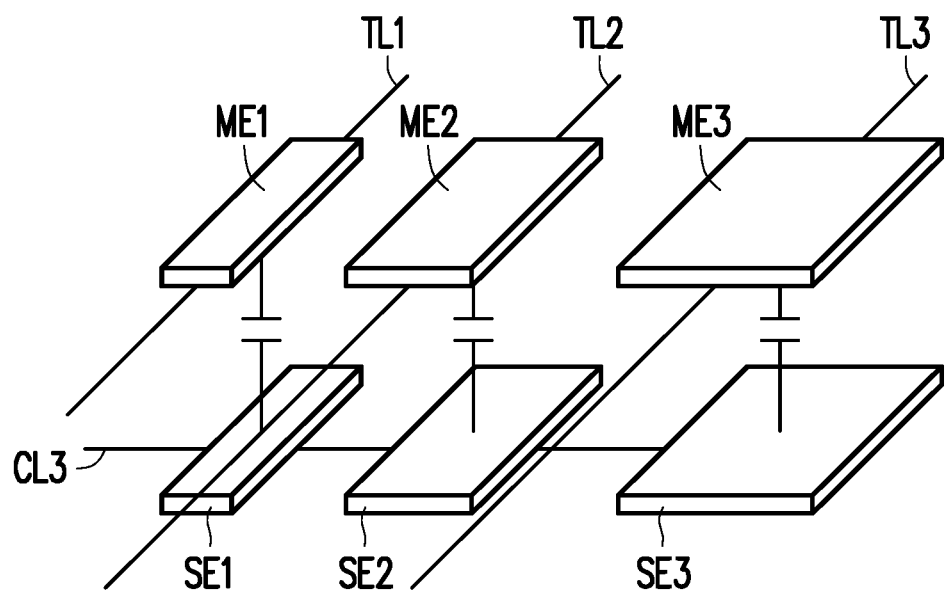
FIG. 5B is a perspective view illustrating the first to the third capacitors, the first to the third touch electrode lines and the third connection lines in FIG. 5A.

FIG. 5A is a partial top view of a free form touch device according to an embodiment of the invention. FIG. 5B is a perspective view illustrating the first to the third capacitors, the first to the third touch electrode lines and the third connection lines in FIG. 5A.

It should be noted that, the embodiment of FIG. 5A and FIG. 5B adopts the reference numbers and part of the content in the embodiments of FIG. 1A to FIG. 4B, where identical or similar reference numbers are used to indicate identical or similar components, and repeated description for the same technical contents is omitted. The omitted description can refer to the foregoing embodiment, which is not repeated hereinafter.

In this embodiment, a free form touch device 20 further includes a first capacitor C1, a second capacitor C2, a third capacitor C3 and a third connection line CL3.

The first capacitor C1 is electrically connected between the first switching device T1 and the first touch electrode E1. The second capacitor C2 is electrically connected between the second switching device T2 and the second touch electrode E2. The third capacitor C3 is electrically connected between the third switching device T3 and the third touch electrode E3.

The first capacitor C1 includes a first main-electrode ME1 and a first sub-electrode SE1. An insulation layer is interposed between the first main-electrode ME1 and the first sub-electrode SE1, for example. The first main-electrode ME1 is electrically connected with the first touch electrode line TL1, for example. The second capacitor C2 includes a second main-electrode ME2 and a second sub-electrode SE2. An insulation layer is interposed between the second main-electrode ME2 and the second sub-electrode SE2, for example. The second main-electrode ME2 is electrically connected with the second touch electrode line TL2, for example. The third capacitor C3 includes a third main-electrode ME3 and a third sub-electrode SE3. An insulation layer is interposed between the third main-electrode ME3 and the third sub-electrode SE3, for example. The third main-electrode ME3 is electrically connected with the third touch electrode line TL3, for example. In this embodiment, the first sub-electrode SE1, the second sub-electrode SE2 and the third sub-electrode SE3 are, for example, electrically connected with the third connection line CL3; the first connection line CL1 is, for example, located between the second connection line CL2 and the third connection line CL3; and the first sub-electrode SE1, the second sub-electrode SE2 and the third sub-electrode SE3 are electrically connected with a common voltage through the third connection line CL3.

In this embodiment, the first sub-electrode SE1/the second sub-electrode SE2/the third sub-electrode SE3 are, for example, located between the substrate SB and the first main-electrode ME1/the second main-electrode ME2/the third main-electrode ME3, but the invention is not limited thereto. In other embodiments, the first main-electrode ME1/the second main-electrode ME2/the third main-electrode ME3 are, for example, located between the substrate SB and the first sub-electrode SE1/the second sub-electrode SE2/the third sub-electrode SE3.

By adjusting areas of the first main-electrode ME1, the second main-electrode ME2, the third main-electrode ME3, the first sub-electrode SE1, the second sub-electrode SE2 and the third sub-electrode SE3, capacitances of the first capacitor C1, the second capacitor C2 and the third capacitor C3 may be changed. In this embodiment, a capacitance of the first capacitor C1 is less than a capacitance of the second capacitor C2, and the capacitance of the second capacitor C2 is less than a capacitance of third capacitor C3. The third capacitor C3 having greater capacitance is electrically connected with the third touch electrode E3 having smaller area, and the first capacitor C1 having smaller capacitance is electrically connected with the first touch electrode E1 having greater area.

By electrically connecting the first capacitor C1, the second capacitor C2 and the third capacitor C3 having different capacitances with the first touch electrode E1, the second touch electrode E2 and the third touch electrode E3 having different areas respectively, the uneven RC loading distribution problem caused by different areas of the first touch electrode E1, the second touch electrode E2 and the third touch electrode E2 may be corrected. In this way, the issue regarding the first touch electrode E1, the second touch electrode E2 and the third touch electrode E3 having different signal recovery speeds may be solved.

In this embodiment, the issue regarding the first touch electrode E1, the second touch electrode E2 and the third touch electrode E3 having different signal recovery speeds may be solved simply by the first capacitor C1, the second capacitor C2 and the third capacitor C3 having different capacitances without making the first switching device T1, the second switching device T2 and the third switching device T3 to include different impedances. However, the invention is not limited in this regard. The impedances of the first switching device T1, the second switching device T2 and the third switching device T3 may also be different such that the issue regarding the first touch electrode E1, the second touch electrode E2 and the third touch electrode E3 having different signal recovery speeds may be further solved more thoroughly.

Figure 6A:
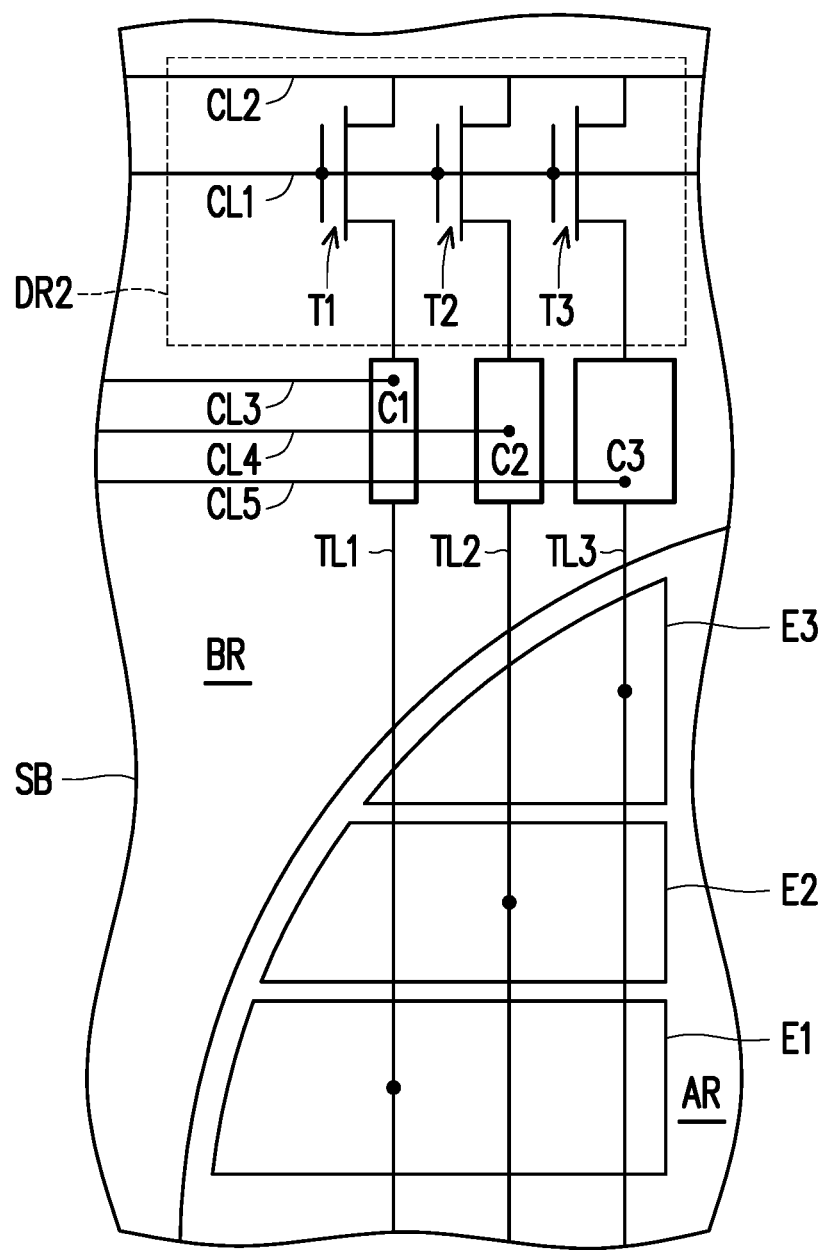
FIG. 6A is a partial top view of a free form touch device according to an embodiment of the invention.
Figure 6B:
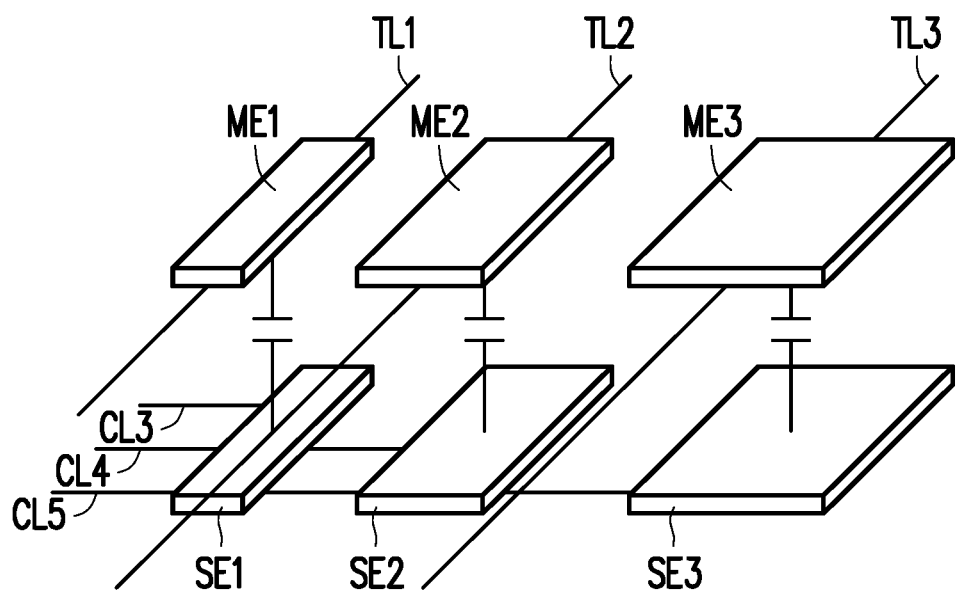
FIG. 6B is a perspective view illustrating the first to the third capacitors, the first to the third touch electrode lines and the third to the fifth connection lines in FIG. 6A.

FIG. 6A is a partial top view of a free form touch device according to an embodiment of the invention. FIG. 6B is a perspective view illustrating the first to the third capacitors, the first to the third touch electrode lines and the third to the fifth connection lines in FIG. 6A.

It should be noted that, the embodiment of FIG. 6A and FIG. 6B adopts the reference numbers and part of the content in the embodiment of FIG. 5A and FIG. 5B, where identical or similar reference numbers are used to indicate identical or similar components, and repeated description for the same technical contents is omitted. The omitted description can refer to the foregoing embodiment, which is not repeated hereinafter.

A major difference between a free form touch device 30 of FIG. 6A and the free form touch device 20 of FIG. 5A is that, the first sub-electrode SE1, the second sub-electrode SE2 and the third sub-electrode SE3 of the free form touch device 30 are electrically connected with different connection lines, respectively.

With reference to FIG. 6A and FIG. 6B, in this embodiment, the first sub-electrode SE1, the second sub-electrode SE2 and the third sub-electrode SE3 are electrically connected with the third connection line CL3, a fourth connection line CL4 and a fifth connection line CL5, respectively.

Because the first sub-electrode SE1, the second sub-electrode SE2 and the third sub-electrode SE3 are electrically connected with different connection lines, respectively, different voltages may be respectively applied to the first sub-electrode SE1, the second sub-electrode SE2 and the third sub-electrode SE3.

Figure 7:
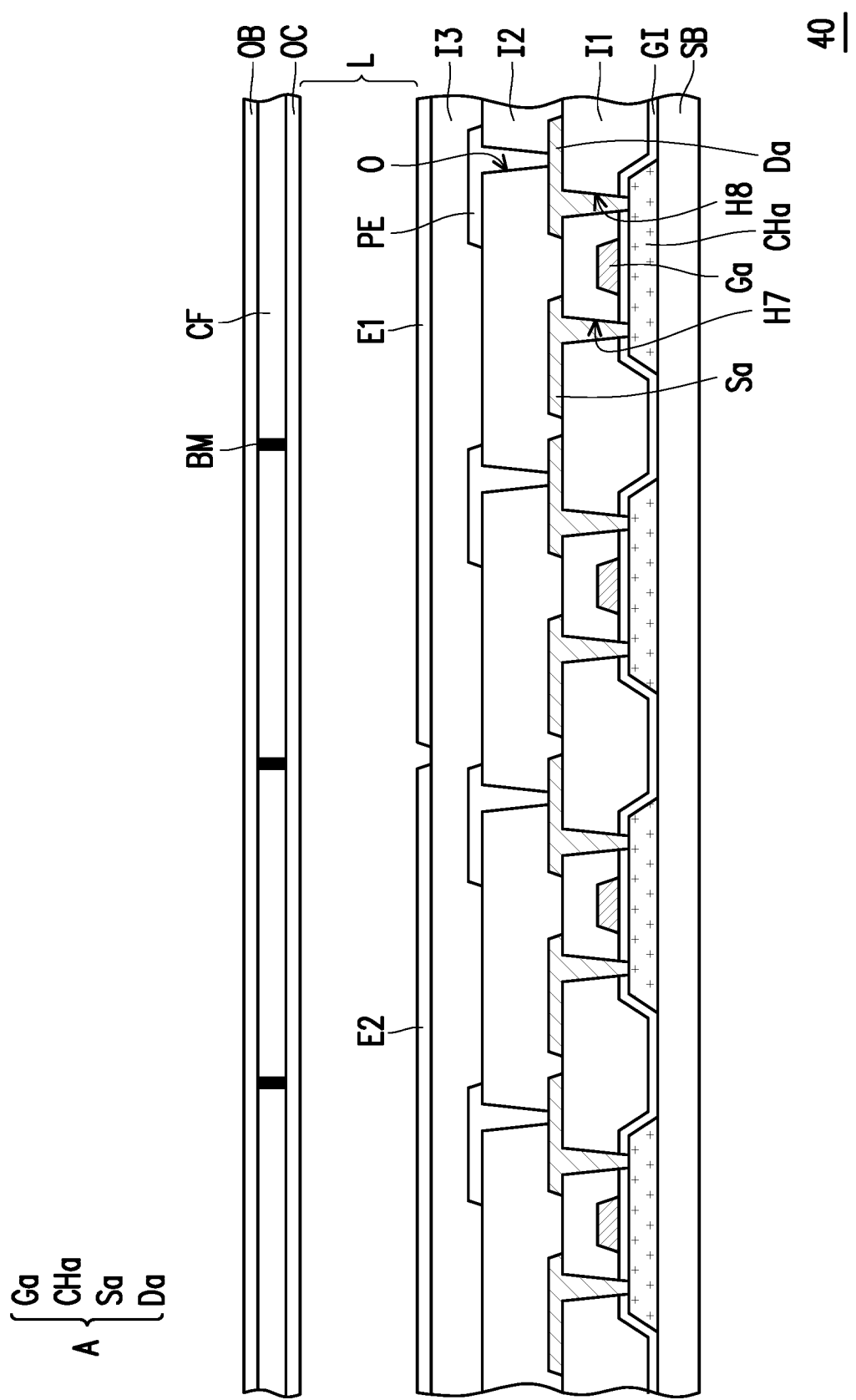
FIG. 7 is a cross-sectional view of a free form touch device according to an embodiment of the invention.

FIG. 7 is a cross-sectional view of a free form touch device according to an embodiment of the invention. It should be noted that, the embodiment of FIG. 7 adopts the reference numbers and part of the content in the embodiment of FIG. 5A and FIG. 5B, where identical or similar reference numbers are used to indicate identical or similar components, and repeated description for the same technical contents is omitted. The omitted description can refer to the foregoing embodiment, which is not repeated hereinafter.

With reference to FIG. 7, a free form touch device 40 further includes a carrier OB, a filter device CF, a black matrix BM, a liquid crystal layer L, a protection layer OC, a plurality of active devices A and a plurality of pixel electrodes PE. The liquid crystal layer L is located between the carrier OB and the substrate SB.

The active devices A are located on the active region AR of the substrate SB (e.g., the active region AR of FIG. 1). The active device A includes a channel layer CHa, a gate Ga, a source Sa and a drain Da. The gate Ga is electrically connected with a scan line (not illustrated). The gate Ga overlaps with the channel layer CHa, and the gate insulation layer GI is interposed between the gate Ga and the channel layer CHa. The first insulation layer I1 covers the gate Ga. The source Sa and the drain Da are located on the first insulation layer I1, and electrically connected with the channel layer CHa through openings H7 and H8, respectively. The openings H7 and H8 at least penetrate the first insulation layer I1. In this embodiment, the openings H7 and H8 penetrate the gate insulation layer GI and the first insulation layer I1. The source Sa is electrically connected with a data line (not illustrated).

In this embodiment, the active devices A are, for example, formed in the same process for manufacturing the first switching device T1 (illustrated in FIG. 2B), the second switching device T2 (illustrated in FIG. 3B), and the third switching device T3 (illustrated in FIG. 4B), but the invention is not limited thereto.

In this embodiment, the active devices A are exemplified by a thin film transistor of the top gate type, but the invention is not limited thereto. In other embodiments, the active devices A may also be a thin film transistor of the bottom gate type or other types.

A second insulation layer I2 covers the source Sa and the drain Da. The pixel electrodes PE are located on the active region AR of the substrate SB. The pixel electrodes PE are located on the second insulation layer I2, and electrically connected with the drain Da of the active device A through an opening O, respectively. The opening O at least penetrates the second insulation layer I2.

A third insulation layer I3 covers the pixel electrodes PE. The first touch electrode E1 and the second touch electrode E2 cover the third insulation layer I3. At least one pixel electrode PE of a first group of the pixel electrodes PE overlaps with the first touch electrode E1, and at least one pixel electrode PE of a second group of the pixel electrodes PE overlaps with the second touch electrode E2. Any one of the first group of the pixel electrodes PE does not belong to the second group of the pixel electrodes PE. Although two of the pixel electrodes PE overlapping with the first touch electrode E1 and other two of the pixel electrodes PE overlapping with the second touch electrode E2 are illustrated in FIG. 7 as an example, the invention is not limited thereto. The number of the pixel electrodes PE overlapping with the first touch electrode E1 and the number of the pixel electrodes PE overlapping with the second touch electrode E2 may be adjusted based on actual requirements, and the number of the pixel electrodes PE overlapping with the first touch electrode E1 may also be different from the number of the pixel electrodes PE overlapping with the second touch electrode E2.

In this embodiment, the first touch electrode E1 and the second touch electrode E2 may also be used as common electrodes. In certain embodiments, each of the first touch electrode E1 and the second touch electrode E2 may include a plurality of slits so that the free form touch device is a fringe field switching (FFS) liquid crystal display touch device. In other embodiments, the pixel electrodes are located above the common electrode. That is to say, the pixel electrodes are located between the common electrode and the liquid crystal layer L; the first touch electrode and the second touch electrode are used as the common electrodes; and each of the pixel electrodes has a plurality of slits.

In this embodiment, the first touch electrode E1, the second touch electrode E2, the first main-electrode ME1, the second main-electrode ME2 and the third main-electrode ME3 are formed by patterning one same film layer, and the pixel electrodes PE, the first sub-electrode SE1, the second sub-electrode SE2 and the third sub-electrode SE3 are formed by patterning another same film layer. However, the invention is not limited in this regard. In other embodiments, the first touch electrode E1, the second touch electrode E2, the first main-electrode ME1, the second main-electrode ME2 and the third main-electrode ME3 are formed by patterning one same film layer, and the first sub-electrode SE1, the second sub-electrode SE2 and the third sub-electrode SE3 are formed by patterning another same film layer but not formed by patterning the same film layer as the pixel electrodes PE.

In this embodiment, the filter device CF and the black matrix BM are located on the carrier OB. The filter device CF includes, for example, a plurality of filter patterns in different colors, and the black matrix BM is located between the filter patterns in different colors. The protection layer OC covers the filter device CF, and is located between the filter device CF and the liquid crystal layer L.

Although the free form touch device 40 adopts the fringe field switching (FFS) liquid crystal display touch device as an example in this embodiment, the invention is not limited thereto. In other embodiments, the free form touch device may be a liquid crystal display device that adopts an in-plane switching (IPS) technology, a vertical alignment (VA) technology or other technologies.

Figure 8:
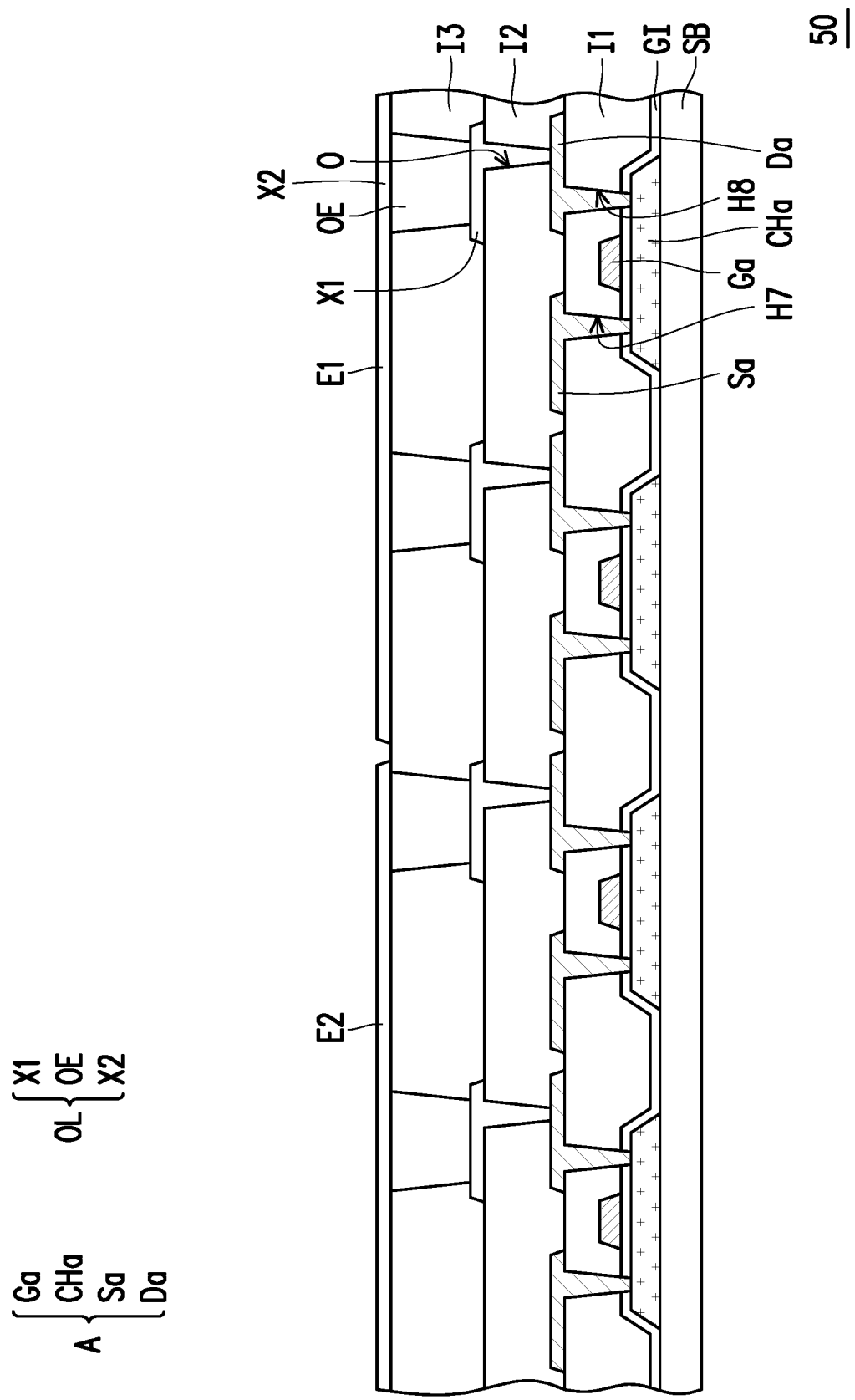
FIG. 8 is a cross-sectional view of a free form touch device according to an embodiment of the invention.

FIG. 8 is a cross-sectional view of a free form touch device according to an embodiment of the invention. It should be noted that, the embodiment of FIG. 8 adopts the reference numbers and part of the content in the embodiment of FIG. 7, where identical or similar reference numbers are used to indicate identical or similar components, and repeated description for the same technical contents is omitted. The omitted description can refer to the foregoing embodiment, which is not repeated hereinafter.

With reference to FIG. 8, in this embodiment, a free form touch device 50 is an organic light-emitting diode liquid crystal display device.

A major difference between the free form touch device 50 of FIG. 8 and the free form touch device 40 of FIG. 7 is that, the free form touch device 50 includes a plurality of organic light-emitting diodes OL.

The organic light-emitting diode OL includes a first electrode X1, a second electrode X2 and an organic light-emitting layer OE located between the first electrode X1 and the second electrode X2. The organic light-emitting diodes OL are electrically connected with the active devices A, respectively. In this embodiment, the first electrode X1 of the organic light-emitting diode OL is electrically connected with the drain Da of the active device A through the opening O.

The third insulation layer I3 covers the first electrode T1. The first touch electrode E1 and the second touch electrode E2 cover the third insulation layer I3.

In this embodiment, at least one organic light-emitting diodes OL of a first group of the organic light-emitting diodes OL is electrically connected with the first touch electrode E1, and at least one organic light-emitting diodes OL of a second group of the organic light-emitting diodes OL is electrically connected with the second touch electrode E2. Any one of the first group of the organic light-emitting diodes OL does not belong to the second group of the organic light-emitting diodes OL. For instance, the second electrode X2 of first group of the organic light-emitting diodes OL is electrically connected with or integrally formed together with the first touch electrode E1, and the second electrode X2 of second group of the organic light-emitting diodes OL is electrically connected with or integrally formed together with the second touch electrode E2.

Figure 9A:
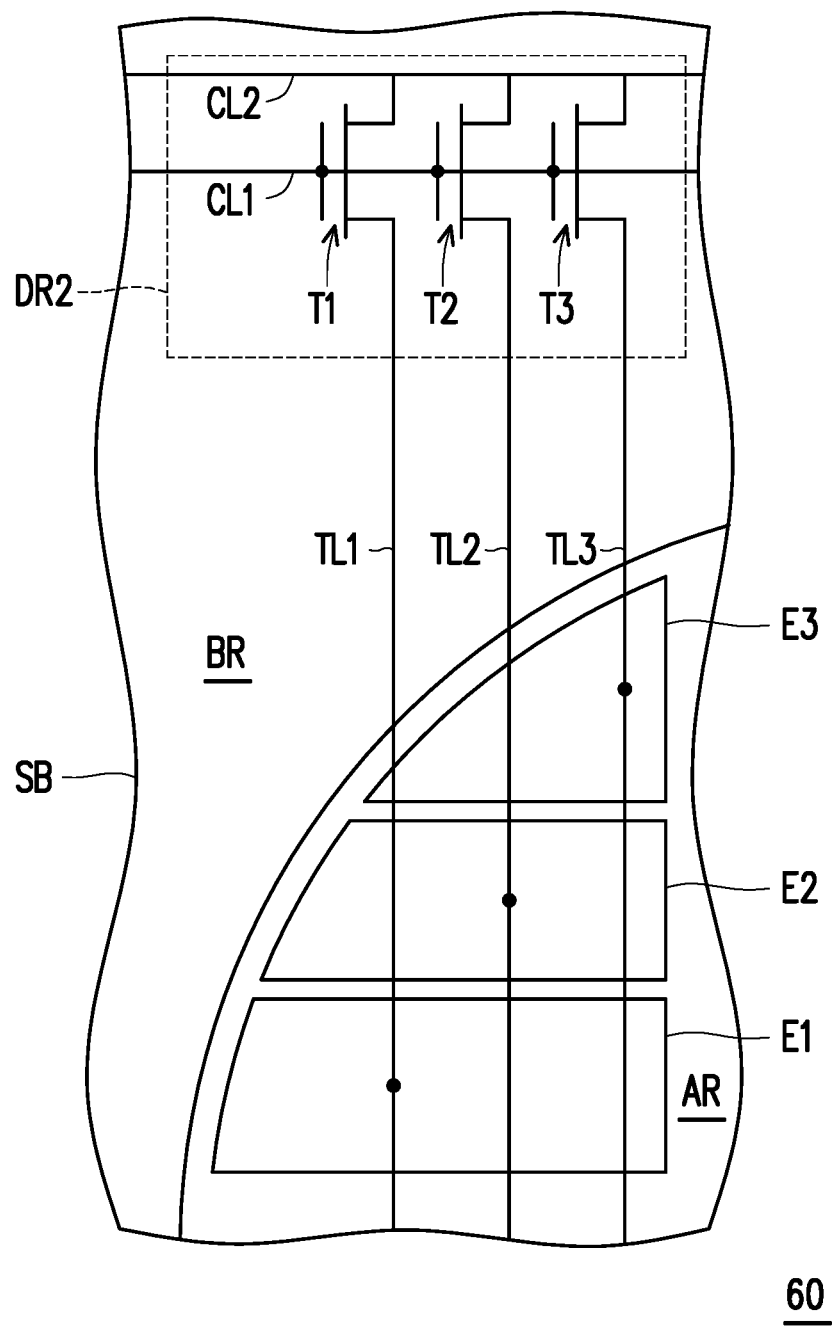
FIG. 9A is a partial top view of a free form touch device according to an embodiment of the invention.
Figure 9B:
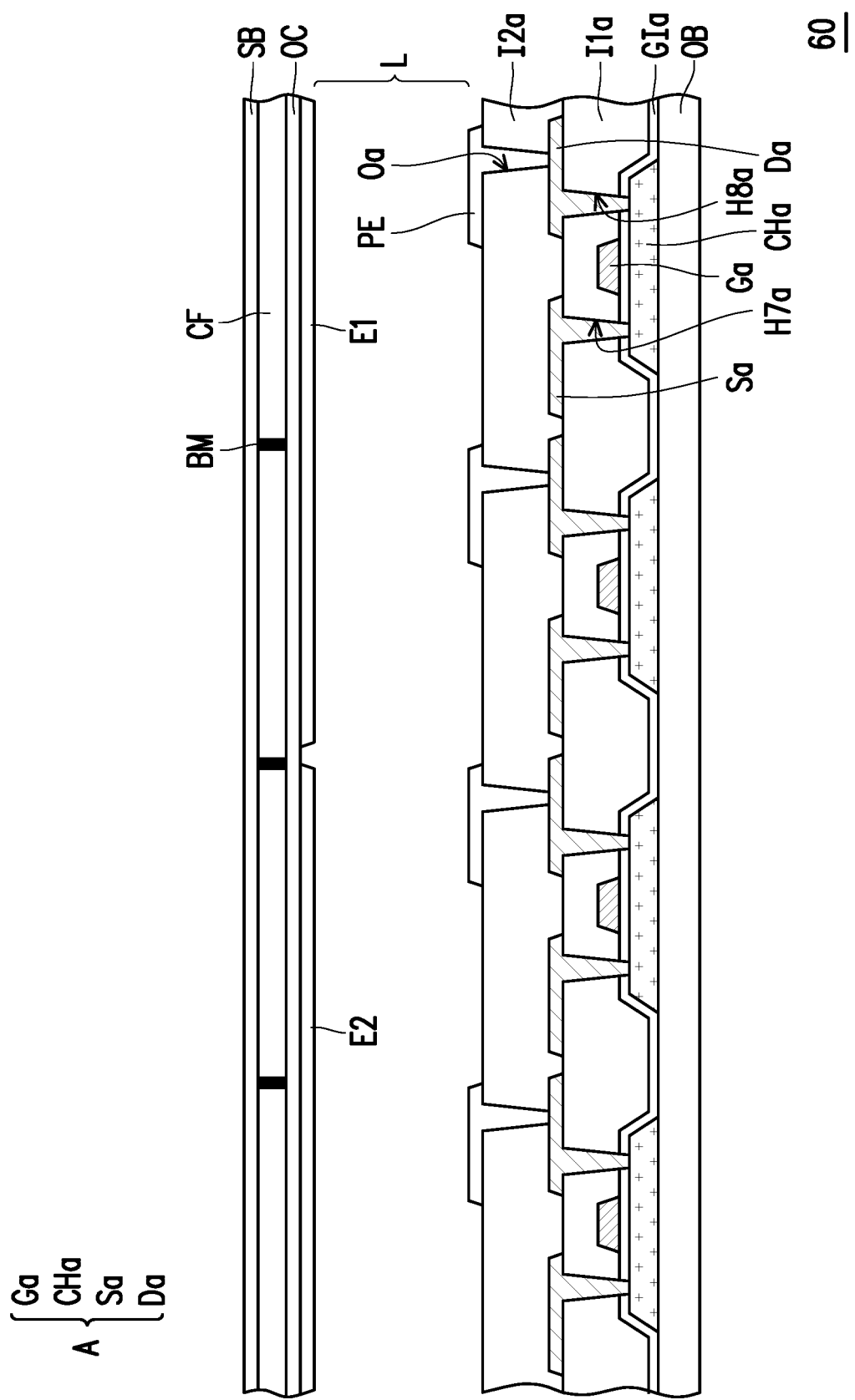
FIG. 9B is a cross-sectional view of a free form touch device according to an embodiment of the invention.

FIG. 9A is a partial top view of a free form touch device according to an embodiment of the invention. FIG. 9B is a cross-sectional view of a free form touch device according to an embodiment of the invention. It should be noted that, the embodiment of FIG. 9A and FIG. 9B adopts the reference numbers and part of the content in the embodiments of FIG. 1A to FIG. 4B, where identical or similar reference numbers are used to indicate identical or similar components, and repeated description for the same technical contents is omitted. The omitted description can refer to the foregoing embodiment, which is not repeated hereinafter.

With reference to FIG. 9A and FIG. 9B, in this embodiment, a free form touch device 60 further includes a carrier OB, a gate insulation layer GIa, a first insulation layer I1a, a second insulation layer I2a, the filter device CF, the black matrix BM, the protection layer OC, the active devices A and the pixel electrodes PE. The liquid crystal layer L is located between the carrier OB and the substrate SB.

In this embodiment, the first to the third switching devices T1 to T3 are located on the substrate SB, and the active devices A are located on the carrier OB.

The active devices A are disposed corresponding to the active region AR of the substrate SB. The active device A includes the channel layer CHa, the gate Ga, the source Sa and the drain Da. The gate Ga is electrically connected with a scan line (not illustrated). The gate Ga overlaps with the channel layer CHa, and the gate insulation layer GIa is interposed between the gate Ga and the channel layer CHa. The first insulation layer I1 covers the gate Ga. The source Sa and the drain Da are located on the first insulation layer I1a, and electrically connected with the channel layer CHa through openings H7a and H8a, respectively. The openings H7a and H8a at least penetrate the first insulation layer I1a. In this embodiment, the openings H7a and H8a penetrate the gate insulation layer GIa and the first insulation layer I1a. The source Sa is electrically connected with a data line (not illustrated).

The second insulation layer I2a covers the source Sa and the drain Da. The pixel electrodes PE are located on carrier OB, and disposed corresponding to the active region AR of the substrate SB. The pixel electrodes PE are located on the second insulation layer I2a, and electrically connected with the drain Da of the active device A through an opening Oa, respectively. The opening Oa at least penetrates the second insulation layer I2a.

At least one pixel electrode PE of a first group of the pixel electrodes PE overlaps with the first touch electrode E1, and at least one pixel electrode PE of a second group of the pixel electrodes PE overlaps with the second touch electrode E2. The first touch electrode E1 and the second touch electrode E2 may be used as the common electrodes.

In certain embodiments, an additional common electrode or additional common electrodes (not illustrated) may be formed between the carrier OB and the substrate SB. In other words, it is also possible that the first touch electrode E1 and the second touch electrode E2 are not used as the common electrodes.

In this embodiment, the filter device CF and the black matrix BM are located on the substrate SB. The filter device CF includes, for example, a plurality of filter patterns in different colors, and the black matrix BM is located between the filter patterns in different colors. The protection layer OC covers the filter device CF, and is located between the filter device CF and the liquid crystal layer L.

In summary, at least one embodiment of the invention can solve the uneven RC loading distribution problem caused by different areas of the touch electrodes by electrically connecting the switching devices having different impedances with the touch electrodes having different areas, so as to solve the issue regarding the touch electrodes having different signal recovery speeds.

At least one embodiment of the invention can solve the uneven RC loading distribution problem caused by different areas of the touch electrodes by electrically connecting the capacitors having different capacitances with the touch electrodes having different areas, so as to solve the issue regarding the touch electrodes having different signal recovery speeds.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A free form touch device, comprising:
    a substrate;
    a first switching device, comprising a first channel layer, a first gate, a first source and a first drain, wherein an overlapping width of the first gate and the first channel layer is W1, and an overlapping length of the first gate and the first channel layer is L1;
    a first touch electrode, located on the substrate, and electrically connected with the first switching device, wherein an area of the first touch electrode is A1;
    a second switching device, comprising a second channel layer, a second gate, a second source and a second drain, wherein an overlapping width of the second gate and the second channel layer is W2, and an overlapping length of the second gate and the second channel layer is L2, wherein W1/L1>W2/L2; and
    a second touch electrode, located on the substrate, and electrically connected with the second switching device, wherein an area of the second touch electrode is A2, and A1>A2.

2. The free form touch device according to claim 1, further comprising:
    a third switching device, having a third channel layer, a third gate, a third source and a third drain, wherein an overlapping width of the third gate and the third channel layer is W3, and an overlapping length of the third gate and the third channel layer is L3, wherein W2/L2>W3/L3; and
    a third touch electrode, located on the substrate, and electrically connected with the third switching device, wherein an area of the third touch electrode is A3, and A2>A3.

3. The free form touch device according to claim 1, further comprising:
    a first capacitor, electrically connected between the first switching device and the first touch electrode; and
    a second capacitor, electrically connected between the second switching device and the second touch electrode, wherein a capacitance of the first capacitor is less than a capacitance of the second capacitor.

4. The free form touch device according to claim 3, wherein the first capacitor comprises a first main-electrode and a first sub-electrode, and the second capacitor comprises a second main-electrode and a second sub-electrode, wherein the first sub-electrode is electrically connected with the second sub-electrode.

5. The free form touch device according to claim 4, further comprising:
    a plurality of active devices, located on the substrate; and
    a plurality of pixel electrodes, located on the substrate, and electrically connected with the active devices, respectively, wherein at least one pixel electrode of a first group of the pixel electrodes overlaps with the first touch electrode, at least one pixel electrode of a second group of the pixel electrodes overlaps with the second touch electrode, wherein the first touch electrode, the second touch electrode, the first sub-electrode and the second sub-electrode are formed by patterning one same film layer, and the pixel electrodes, the first main-electrode and the second main-electrode are formed by patterning another same film layer.

6. The free form touch device according to claim 5, wherein the first group of the pixel electrodes overlap with the first touch electrode, the second group of the pixel electrodes overlap with the second touch electrode, and any one of the first group of the pixel electrodes does not belong to the second group of the pixel electrodes.

7. The free form touch device according to claim 4, further comprising:
    a plurality of active devices, located on the substrate; and
    a plurality of organic light-emitting diodes, electrically connected with the active devices, respectively, wherein at least one organic light-emitting diode of a first group of the organic light-emitting diodes is electrically connected with the first touch electrode, and at least one organic light-emitting diode of a second group of the organic light-emitting diodes is electrically connected with the second touch electrode.

8. The free form touch device according to claim 7, wherein the first group of the organic light-emitting diodes are electrically connected with the first touch electrode, the second group of the organic light-emitting diodes are electrically connected with the second touch electrode, and any one of the first group of the organic light-emitting diodes does not belong to the second group of the organic light-emitting diodes.

9. The free form touch device according to claim 4, further comprising:
    a carrier;
    a plurality of active devices, located on the carrier; and
    a plurality of pixel electrodes, located on the carrier, and electrically connected with the active devices, respectively, wherein at least one pixel electrode of a first group of the pixel electrodes overlaps with the first touch electrode, and at least one pixel electrode of a second group of the pixel electrodes overlaps with the second touch electrode; and
    a liquid crystal layer, located between the substrate and the carrier.

10. The free form touch device according to claim 9, wherein the first group of the pixel electrodes overlap with the first touch electrode, the second group of the pixel electrodes overlap with the second touch electrode, and any one of the first group of the pixel electrodes does not belong to the second group of the pixel electrodes.

11. A free form touch device, comprising:
    a substrate;
    a first switching device;
    a first touch electrode, located on the substrate, and electrically connected with the first switching device, wherein an area of the first touch electrode is A1;
    a first capacitor, electrically connected between the first switching device and the first touch electrode;
    a second switching device;
    a second touch electrode, located on the substrate, and electrically connected with the second switching device, wherein an area of the second touch electrode is A2, and A1>A2; and a second capacitor, electrically connected between the second switching device and the second touch electrode, wherein a capacitance of the first capacitor is less than a capacitance of the second capacitor.

12. The free form touch device according to claim 11, wherein the first capacitor comprises a first main-electrode and a first sub-electrode, and the second capacitor comprises a second main-electrode and a second sub-electrode, wherein the first sub-electrode is electrically connected with the second sub-electrode.

13. The free form touch device according to claim 12, further comprising:
a third switching device;
a third touch electrode, located on the substrate, and electrically connected with the third switching device, wherein an area of the third touch electrode is A3, and A2>A3; and
a third capacitor, electrically connected between the third switching device and the third touch electrode, wherein a capacitance of the second capacitor is less than a capacitance of the third capacitor.

14. The free form touch device according to claim 12, further comprising:
a plurality of active devices, located on the substrate; and
a plurality of pixel electrodes, located on the substrate, and electrically connected with the active devices, respectively, wherein at least one pixel electrode of a first group of the pixel electrodes overlaps with the first touch electrode, at least one pixel electrode of a second group of the pixel electrodes overlaps with the second touch electrode, and any one of the first group of the pixel electrodes does not belong to the second group of the pixel electrodes, wherein the first touch electrode, the second touch electrode, the first main-electrode and the second main-electrode are formed by patterning one same film layer, and the pixel electrodes, the first sub-electrode and the second sub-electrode are formed by patterning another same film layer.

15. The free form touch device according to claim 12, further comprising:
a plurality of active devices, located on the substrate; and
a plurality of organic light-emitting diodes, electrically connected with the active devices, respectively, wherein at least one organic light-emitting diode of a first group of the organic light-emitting diodes is electrically connected with the first touch electrode, at least one organic light-emitting diode of a second group of the organic light-emitting diodes is electrically connected with the second touch electrode, and any one of the first group of the organic light-emitting diodes does not belong to the second group of the organic light-emitting diodes.

16. The free form touch device according to claim 12, further comprising:
a carrier;
a plurality of active devices, located on the carrier; and
a plurality of pixel electrodes, located on the carrier, and electrically connected with the active devices, respectively, wherein at least one pixel electrode of a first group of the pixel electrodes overlaps with the first touch electrode, at least one pixel electrode of a second group of the pixel electrodes overlaps with the second touch electrode, and any one of the first group of the pixel electrodes does not belong to the second group of the pixel electrodes; and
a liquid crystal layer, located between the substrate and the carrier.

17. The free form touch device according to claim 12, wherein the substrate is a free form substrate.

* * * * *